United States Patent
Lee et al.

(10) Patent No.: US 9,876,472 B2
(45) Date of Patent: Jan. 23, 2018

(54) ENVELOPE TRACKING POWER AMPLIFYING APPARATUS AND METHOD

(71) Applicants: SAMSUNG ELECTRO-MECHANICS CO., LTD., Suwon-si (KR); Korea Advanced Institute of Science and Technology, Daejeon (KR)

(72) Inventors: Yong Hoon Lee, Daejeon (KR); Eui Rim Jeong, Daejeon (KR); Sang Il Lee, Daejeon (KR); Soon Il Hong, Daejeon (KR); Soon Chan Park, Daejeon (KR); Kwang Pyo Lee, Daejeon (KR); Jong Ok Ha, Suwon-si (KR)

(73) Assignees: Samsung Electro-Mechanics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/270,375

(22) Filed: Sep. 20, 2016

(65) Prior Publication Data

US 2017/0264246 A1 Sep. 14, 2017

(30) Foreign Application Priority Data

Mar. 11, 2016 (KR) .................. 10-2016-0029813

(51) Int. Cl.
*H03F 1/26* (2006.01)
*H03F 1/02* (2006.01)
(Continued)

(52) U.S. Cl.
CPC ......... *H03F 1/0216* (2013.01); *H03F 1/3247* (2013.01); *H03F 3/20* (2013.01);
(Continued)

(58) Field of Classification Search
CPC ............................ H03F 1/3241; H03F 1/3247
(Continued)

(56) References Cited

U.S. PATENT DOCUMENTS

2009/0004981 A1* 1/2009 Eliezer ............... H03F 1/0211
455/127.1
2015/0200703 A1 7/2015 Van et al.

FOREIGN PATENT DOCUMENTS

KR 10-2015-0083711 A 7/2015

OTHER PUBLICATIONS

Hong, Soon Il. "Bandwidth Reduction of Envelope and Digital Pre-Distortion for Envelope Tracking Power Amplifiers." *Dept. of Radio-Wave Engineering, Graduate School of Information & Communication, HANBAT National University* (Aug. 2015) (54 pages, in Korean with English abstract).

* cited by examiner

*Primary Examiner* — Steven J Mottola
(74) *Attorney, Agent, or Firm* — NSIP Law

(57) ABSTRACT

An apparatus includes a first predistorter configured to calculate a first predistortion parameter and configured to distort an input signal using the first predistortion parameter to output a first distortion signal, a second predistorter configured to calculate a second predistortion parameter and configured to distort the first distortion signal using the second predistortion parameter to output a second distortion signal, a power supply configured to receive the first distortion signal to generate a first envelope signal, and configured to limit a bandwidth of the first envelope signal to obtain a second envelope signal to supply a source voltage, and a power amplifier configured to receive the source voltage and to output an output signal obtained by amplifying the second distortion signal.

19 Claims, 8 Drawing Sheets

(51) Int. Cl.
*H03F 1/32* (2006.01)
*H03F 3/20* (2006.01)
(52) U.S. Cl.
CPC .. *H03F 2200/102* (2013.01); *H03F 2200/324* (2013.01); *H03F 2200/435* (2013.01); *H03F 2201/3224* (2013.01)
(58) Field of Classification Search
USPC ........................................................ 330/149
See application file for complete search history.

ENVELOPE TRACKING POWER AMPLIFYING APPARATUS AND METHOD

CROSS-REFERENCE TO RELATED APPLICATIONS

This application claims the benefit under 35 USC 119(a) of Korean Patent Application No. 10-2016-0029813 filed on Mar. 11, 2016 in the Korean Intellectual Property Office, the entire disclosure of which is incorporated herein by reference for all purposes.

BACKGROUND

1. Field

The following description relates to an envelope tracking power amplifying apparatus and method.

2. Description of Related Art

A significant concern in the design of recent digital communications systems is improving power efficiency. In methods for improving the efficiency of power amplifiers in broadband mobile communications systems, a method of using an envelope tracking power amplifier (ETPA), which is a type of high-efficiency power amplifier, has attracted interest.

In general, high efficiency power amplifiers have non-linear characteristics. Thus, as a method for reducing non-linearity, a digital predistortion (DPD) method is commonly used. In such a method, input signals are compensated for by being inverted with respect to nonlinear characteristics of signals in digital regions.

However, as envelope signals have bandwidths that are three or four times wider than those of baseband signals, limitations exist to improve performance through a digital predistortion method and, accordingly, negatively affects power efficiency.

To this end, the use of methods in which envelope signals are passed through low pass filters has been known, but by using such an approach, memory effects in which interference occurs between adjacent samples to which outputs from envelope tracking power amplifiers are transferred may occur.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus includes a first predistorter configured to calculate a first predistortion parameter and configured to distort an input signal using the first predistortion parameter to output a first distortion signal, a second predistorter configured to calculate a second predistortion parameter and configured to distort the first distortion signal using the second predistortion parameter to output a second distortion signal, a power supply configured to receive the first distortion signal to generate a first envelope signal, and configured to limit a bandwidth of the first envelope signal to obtain a second envelope signal to supply a source voltage, and a power amplifier configured to receive the source voltage and to output an output signal obtained by amplifying the second distortion signal.

The power supply may include an envelope generator configured to generate the first envelope signal according to an amplitude of the first distortion signal, and a bandwidth limiter configured to generate the second envelope signal obtained by limiting a bandwidth of the first envelope signal.

The power supply may further include an amplitude detector configured to detect the amplitude of the first distortion signal.

The power supply may further include a power modulator configured to supply the source voltage that has a voltage based on an amplitude of the second envelope signal.

The bandwidth limiter may be a low pass filter that uses a window function.

The first predistorter may include a first adapter configured to calculate the first predistortion parameter, based on a differential error between the input signal and the output signal, and a first predistorter controller configured to output a first distortion signal obtained by distorting an input signal using the first predistortion parameter.

The first adapter may calculate a modeling equation of the power amplifier in order to calculate the first predistortion parameter.

The first predistorter may distort the input signal by using the first predistortion parameter and an output signal that is estimated by using the modeling equation.

The second predistorter may include a second adapter configured to calculate the second predistortion parameter, based on a differential error between the first distortion signal and the second envelope signal, and a second predistorter controller configured to output a second distortion signal obtained by distorting the first distortion signal using the second predistortion parameter.

The second predistorter may distort the first distortion signal using the second predistortion parameter and an output signal that is estimated using a modeling equation of the power amplifier.

The first predistorter and second predistorter may calculate the first and second predistortion parameters using a recursive least-squares (RLS) algorithm, respectively.

In another general aspect, a envelope tracking power amplifying method includes supplying a source voltage in response to receiving a second envelope signal obtained by limiting a bandwidth of a first envelope signal of an input signal, calculating a modeling equation of a power amplifier based on the source voltage, calculating a second predistortion parameter using the input signal and the second envelope signal, applying the second predistortion parameter to a second predistorter, and calculating a first predistortion parameter using an output signal obtained by amplifying a signal distorted by the second predistorter and the input signal.

The supplying of the source voltage may include detecting an amplitude of the input signal, generating a first envelope signal according to the detected amplitude, and limiting a bandwidth of the first envelope signal.

The modeling equation and the first and second predistortion parameters may be calculated using a recursive least-squares (RLS) algorithm.

The second envelope signal may be a signal obtained by limiting a bandwidth of the first envelope signal through a low pass filter using a window function.

The calculating of the second predistortion parameter may be performed by calculating a second predistortion parameter, which is a polynomial parameter, and by distorting the input signal to compensate for a differential error between the input signal and the second envelope signal.

The calculating of the first predistortion parameter may be performed by calculating a first predistortion parameter, which is a polynomial parameter, and by distorting the input signal to compensate for a differential error between the output signal obtained by amplifying a signal distorted by the second predistorter and the input signal.

The method may further include applying the first predistortion parameter to a first predistorter.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
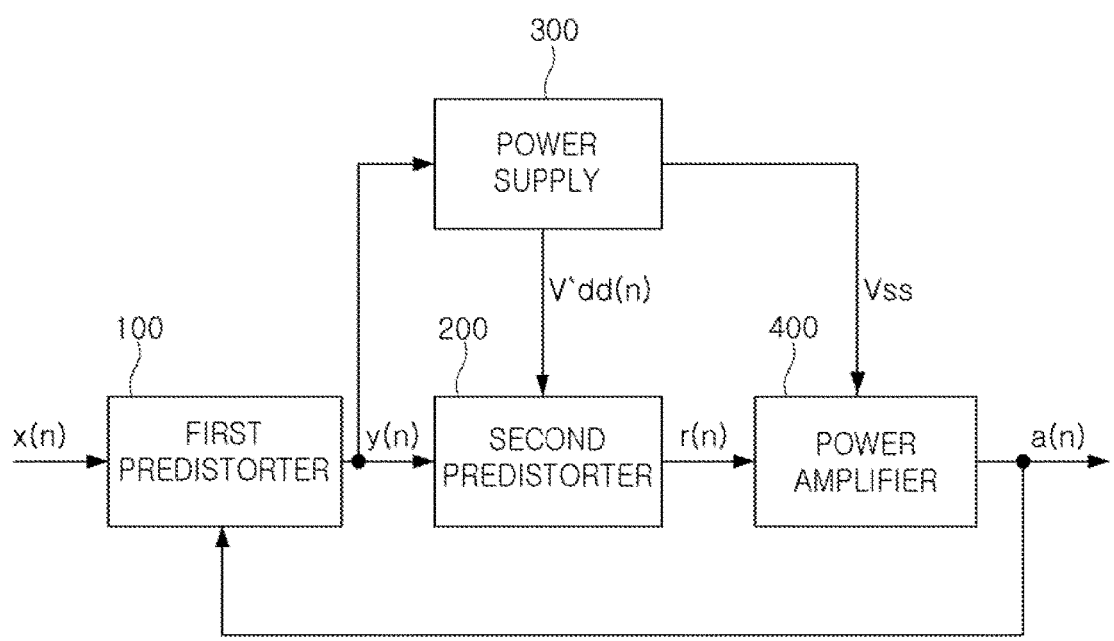
FIG. 1 is a block diagram of an example of an envelope tracking power amplifying apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, embodiments are described with reference to schematic views. In the drawings, for example, due to manufacturing techniques and/or tolerances, modifications of the shape shown may be estimated. Thus, embodiments are not to be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

An aspect of the present disclosure is to provide an envelope tracking power amplifying apparatus and method, in which a memory effect may be reduced and linearity may be secured.

FIG. 1 is a block diagram of an example of an envelope tracking power amplifying apparatus.

With reference to the example of FIG. 1, an example of an envelope tracking power amplifying apparatus includes a first predistorter 100, a second predistorter 200, a power supply 300, and a power amplifier 400.

The first predistorter 100 calculates a first predistortion parameter using an input signal x(n) and an output signal a(n), and outputs a first distortion signal y(n) obtained by distorting the input signal x(n) using the first predistortion parameter.

In detail, the first predistorter 100 compares levels of the input signal x(n) and the output signal a(n) of the power amplifier (PA) 400 with each other. In addition, the first predistorter 100 updates the first predistortion parameter, which is a polynomial parameter, significantly reducing a differential error between the input signal x(n) and the output signal a(n) by using an adaptive algorithm, and distorts the input signal using the first predistortion parameter in order to compensate for nonlinearity of the power amplifier 400. In this example, as the adaptive algorithm, a recursive least-squares (RLS) algorithm may be used. However, in other examples, other adaptive algorithms may be used.

The second predistorter 200 calculates a second predistortion parameter using the input signal x(n) and a second envelope signal V'dd(n), and outputs a second distortion signal r(n) obtained by distorting the first distortion signal y(n) using the second predistortion parameter.

In further detail, the second predistorter 200 compares levels of the input signal x(n) and the second envelope signal V'dd(n) of the power amplifier 400 with each other. Additionally, the second predistorter 200 updates the second predistortion parameter, which is a polynomial parameter, significantly reducing a differential error between the input signal x(n) and the second envelope signal V'dd(n) by using an adaptive algorithm, and distorts the first distortion signal y(n) using the second predistortion parameter to remove memory effects of the power amplifier 400. In this example, as the adaptive algorithm, a recursive least-squares (RLS) algorithm may be used. However, in other examples, other adaptive algorithms are used.

The second predistorter 200 receives the input signal x(n) used in calculating the second predistortion parameter, from the first predistorter 100.

The power supply 300 receives the first distortion signal y(n) to generate a first envelope signal Vdd(n), and supplies a source voltage Vss in response to the second envelope signal V'dd(n) obtained by limiting a bandwidth of the first envelope signal Vdd(n).

In further detail, the power supply 300 receives the first distortion signal y(n) from the first predistorter 100, and generates the first envelope signal Vdd(n) according to a magnitude of the first distortion signal y(n). Additionally, the power supply 300 generates the second envelope signal V'dd(n) obtained by limiting a bandwidth of the first envelope signal Vdd(n) using, for example, a bandwidth limiting filter such as a low pass filter. However, this is only an example, and other appropriate filters may be used in other examples. Furthermore, the power supply 300 supplies the source voltage Vss to the power amplifier 400 in response to receiving the second envelope signal V'dd(n).

The power amplifier 400 outputs an output signal obtained by amplifying a signal obtained by distorting the input signal x(n), for example, the second distortion signal r(n) in the example of FIG. 1.

In further detail, the power amplifier 400 receives the source voltage Vss corresponding to the second envelope signal V'dd(n), as a drain voltage. Since a level of the source voltage Vss is varied according to an envelope of the input signal, the power amplifier 400 may have relatively high power efficiency as a result.

However, the second envelope signal V'dd(n) has a limited bandwidth with respect to causing the occurrence of time variation in the drain voltage of the power amplifier 400.

Because the power amplifier 400 amplifies the second distortion signal r(in) that is distorted by the first and second predistorters 100 and 200, nonlinearity characteristics of the power amplifier 400 may be improved accordingly. Additionally, time variation with respect to the drain voltage is compensated for in order to remove memory effects from the output signal a(n) of the power amplifier 400. Although the first predistorter 100 and the second predistorter 200 are illustrated as separate structural processors, each configured to perform the functions as previously described, in an embodiment, the first predistorter 100 and the second predistorter 200 may be structurally combined as a single structural processor. Furthermore, in an embodiment, the power supply 300 and the power amplifier 400 may be structurally external to the first and second predistorters 100 and 200. However, in an embodiment, the power amplifier 400 and the power supply 300 may be integrally part of the second predistorter 200.

Figure 2:
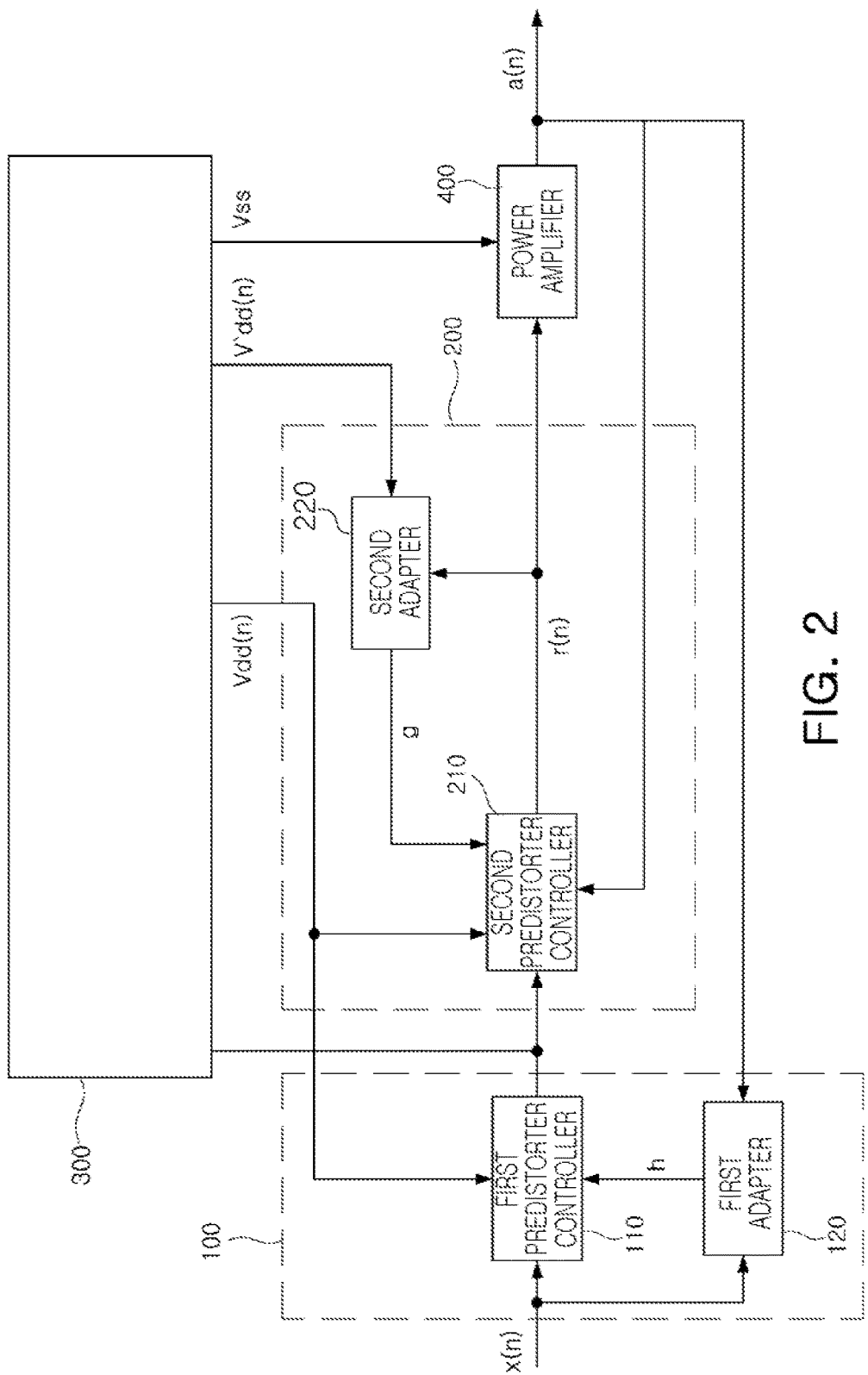
FIG. 2 is a detailed block diagram of an example of an envelope tracking power amplifying apparatus.

FIG. 2 is a detailed block diagram of an example of an envelope tracking power amplifying apparatus;

With reference to FIG. 2, an example of an envelope tracking power amplifying apparatus includes the first predistorter 100, the second predistorter 200, the power supply 300, and the power amplifier 400.

The first predistorter 100 includes a first adapter 120 that calculates a first predistortion parameter h, based on a differential error between the input signal x(n) and the output signal a(n), and a first predistorter controller 110 configured to output a first distortion signal y(n) obtained by distorting the input signal x(n) using the first predistortion parameter. For example, the first predistortion parameter h may be a polynomial parameter that distorts the input signal to compensate for a differential error between the output signal obtained by amplifying a signal distorted by the second predistorter controller 210 and the input signal x(n).

The second predistorter 200 includes a second adapter 220 that calculates the second predistortion parameter, based on a differential error between the first distortion signal y(n) and the second envelope signal V'dd(n), and a second predistorter controller 210 configured to output a second distortion signal r(n) obtained by distorting the first distortion signal y(n) using the second predistortion parameter. For example, the second predistortion parameter may be a polynomial parameter obtained by distorting the input signal to compensate for a differential error between the input signal x(n) and the second envelope signal V'dd(n).

The power supply 300 includes an envelope generator that generates a first envelope signal Vdd(n) according to an amplitude of the first distortion signal y(n), and a bandwidth limiter that generates a second envelope signal V'dd(n) that is obtained by limiting a bandwidth of the first envelope signal.

Figure 3:
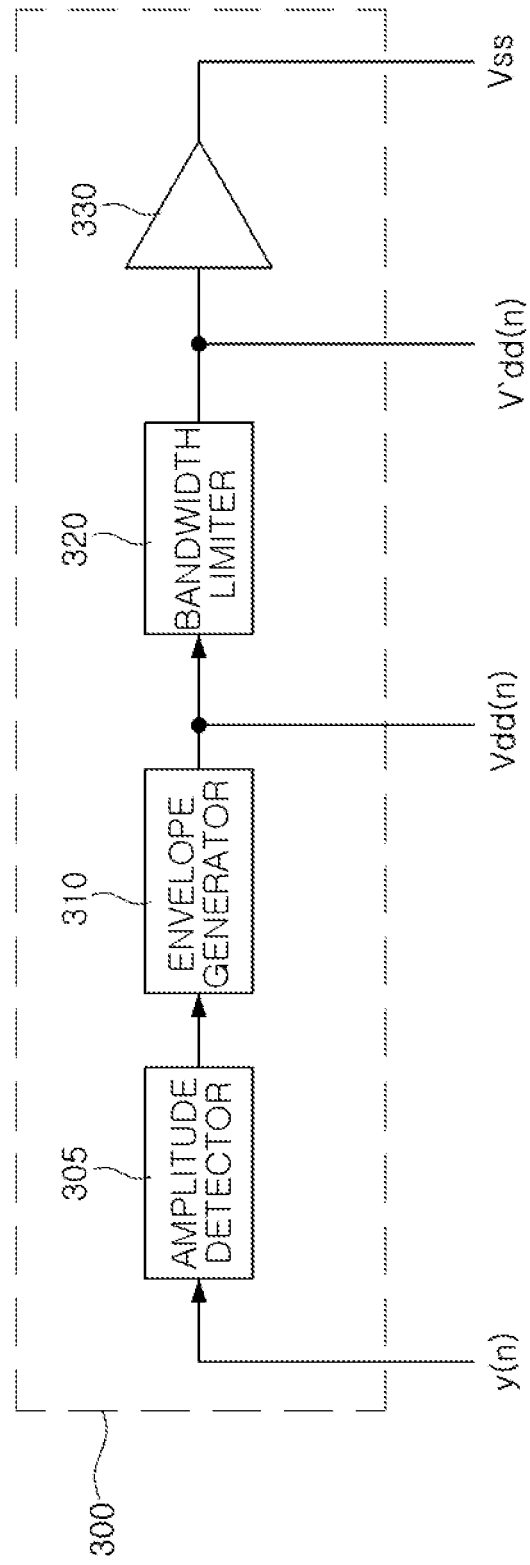
FIG. 3 illustrates a method for calculating a modeling equation of a power amplifier.

In addition, in the example of FIG. 3, the power supply 300 further includes an amplitude detector 305 that detects an amplitude of the first distortion signal y(n), and further includes a power modulator 330 that provides the source voltage Vss as having a voltage based on an amplitude of the second envelope signal. For example, the bandwidth limiter 320 may be a digital filter serving as a low pass filter, but this is only an example and other filters may be used, as appropriate. For example, during this process, a window function for sectioning a signal, hamming, hanning, or Kaiser windows may be used.

For example, the first adapter 120 calculates a modeling equation of the power amplifier 400 in order to calculate the first predistortion parameter h.

In a further detailed description with reference to FIGS. 2 and 3, the first adapter 120 receives the input signal x(n) and the output signal a(n) in a bypass state, in which the first predistorter controller 110 and the second predistorter controller 210 transfer a signal, that the first predistorter controller 110 and the second predistorter controller 210 receive as input, as an output signal, as it is, without distorting the input signal.

The first adapter 120 calculates a modeling equation corresponding to the power amplifier 400 modeled based on the input signal x(n) and the output signal a(n).

The first predistorter controller 110 distorts the input signal x(n) by using the first predistortion parameter h and an output signal a'(n) that is estimated by using the modeling equation. In addition, the second predistorter controller 210 distorts the first distortion signal y(n) using a second predistortion parameter g and the output signal a'(n) that is estimated by using the modeling equation.

Figure 4:
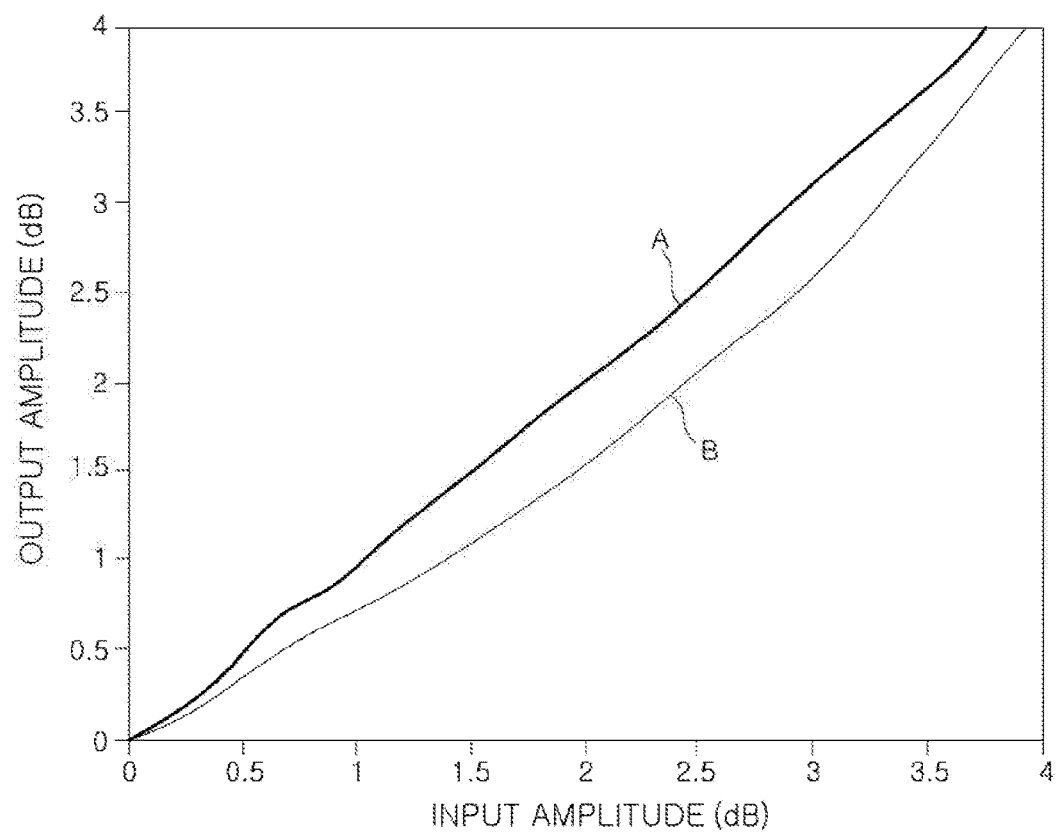
FIGS. 4 and 5 are graphs illustrating results of outputs with respect to inputs for an example of an envelope tracking power amplifying apparatus, with regulated values.
Figure 5:
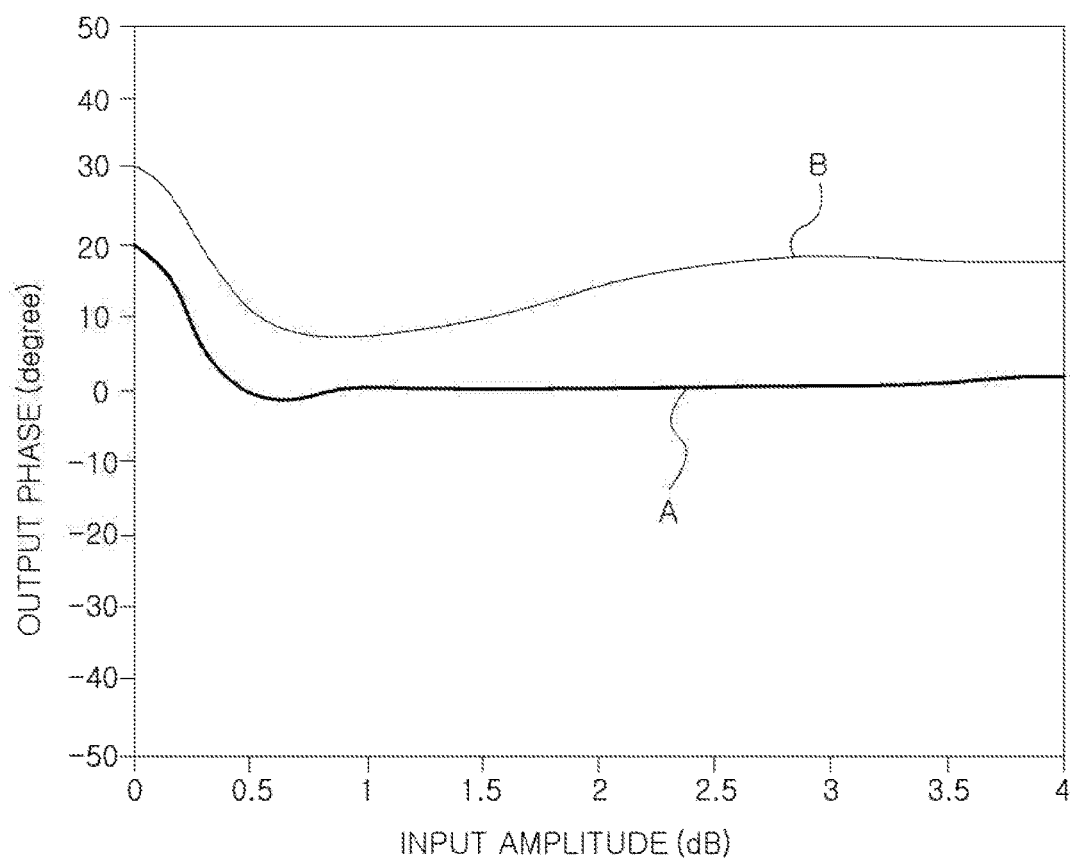

FIGS. 4 and 5 are graphs illustrating results of outputs with respect to inputs to an example of an envelope tracking power amplifying apparatus, with regulated values.

FIGS. 4 and 5 respectively illustrate AM-AM characteristics and AM-PM characteristics of an envelope tracking power amplifying apparatus. For example, an envelope tracking power amplifying apparatus to which predistortion has not been applied represents nonlinearity as illustrated in B of the graph. However, the envelope tracking power amplifying apparatus to which predistortion has been applied represents linearity as illustrated in A of the graph.

Figure 6:
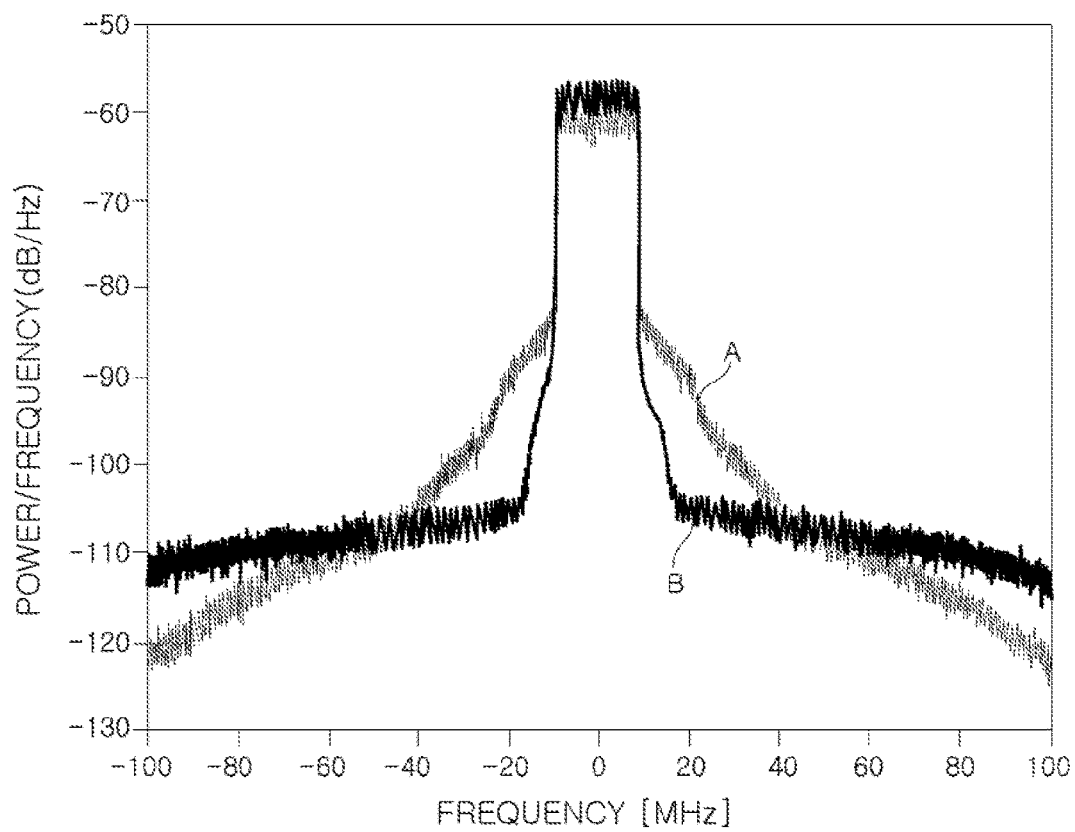
FIG. 6 is a graph illustrating a power spectral density of an example of an envelope tracking power amplifying apparatus.

FIG. 6 is a graph illustrating a power spectral density of an example of an envelope tracking power amplifying apparatus.

Thus, an envelope tracking power amplifying apparatus to which predistortion has not been applied represents a spectrum as illustrated in A of the graph of the example of FIG. 6, and the envelope tracking power amplifying apparatus to which predistortion has been applied represents a spectrum as illustrated in B of the graph of the example of FIG. 6. With reference to the example of FIG. 6, it is able to be confirmed that adjacent channel power ratio is improved in the envelope tracking power amplifying apparatus to which predistortion has been applied according to an embodiment.

Figure 7:
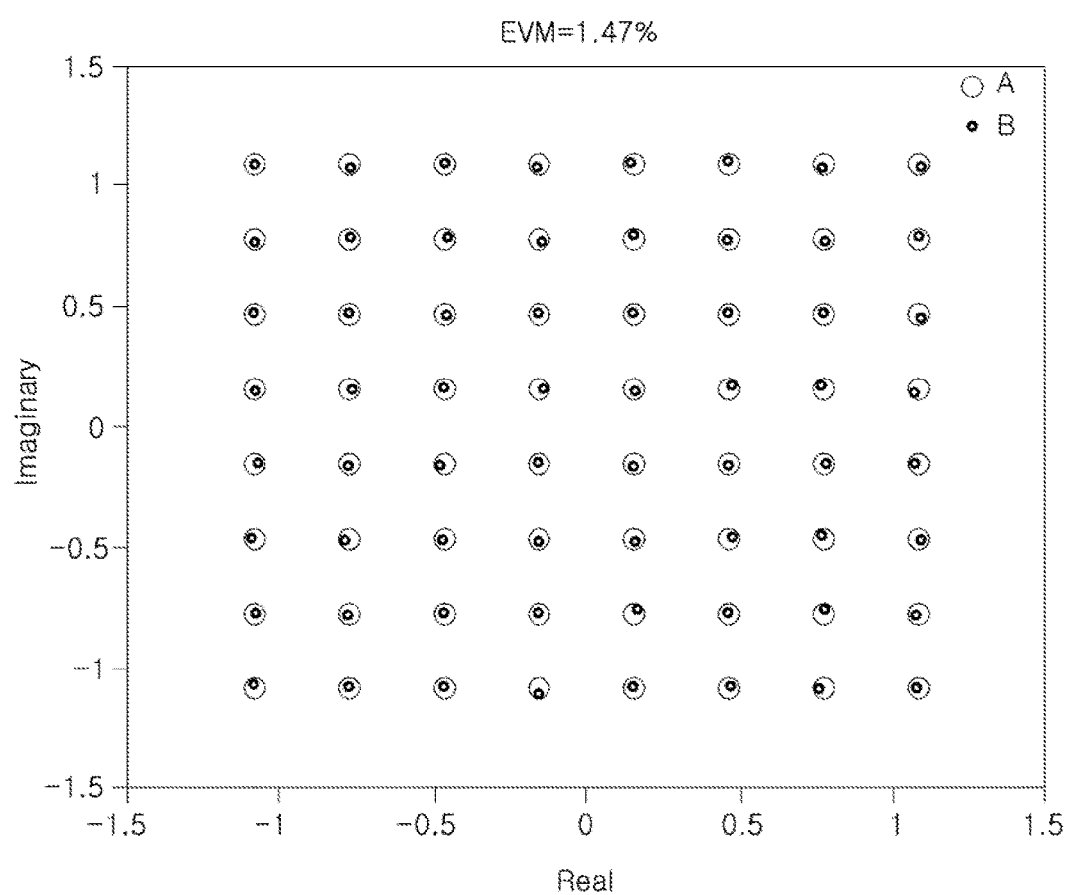
FIG. 7 is a constellation mapping diagram illustrating linear characteristics of an example of an envelope tracking power amplifying apparatus.

FIG. 7 is a constellation mapping diagram illustrating linear characteristics of an example of an envelope tracking power amplifying apparatus. With reference to FIG. 7, it is to be appreciated that an output B produced by the envelope tracking power amplifying apparatus to which predistortion has been applied according to an embodiment has improved linear characteristics, while also allowing a differential error to be within an allowable range so as not to invade an output A from a power amplifier suitable therefor and an adjacent frequency region.

Figure 8:
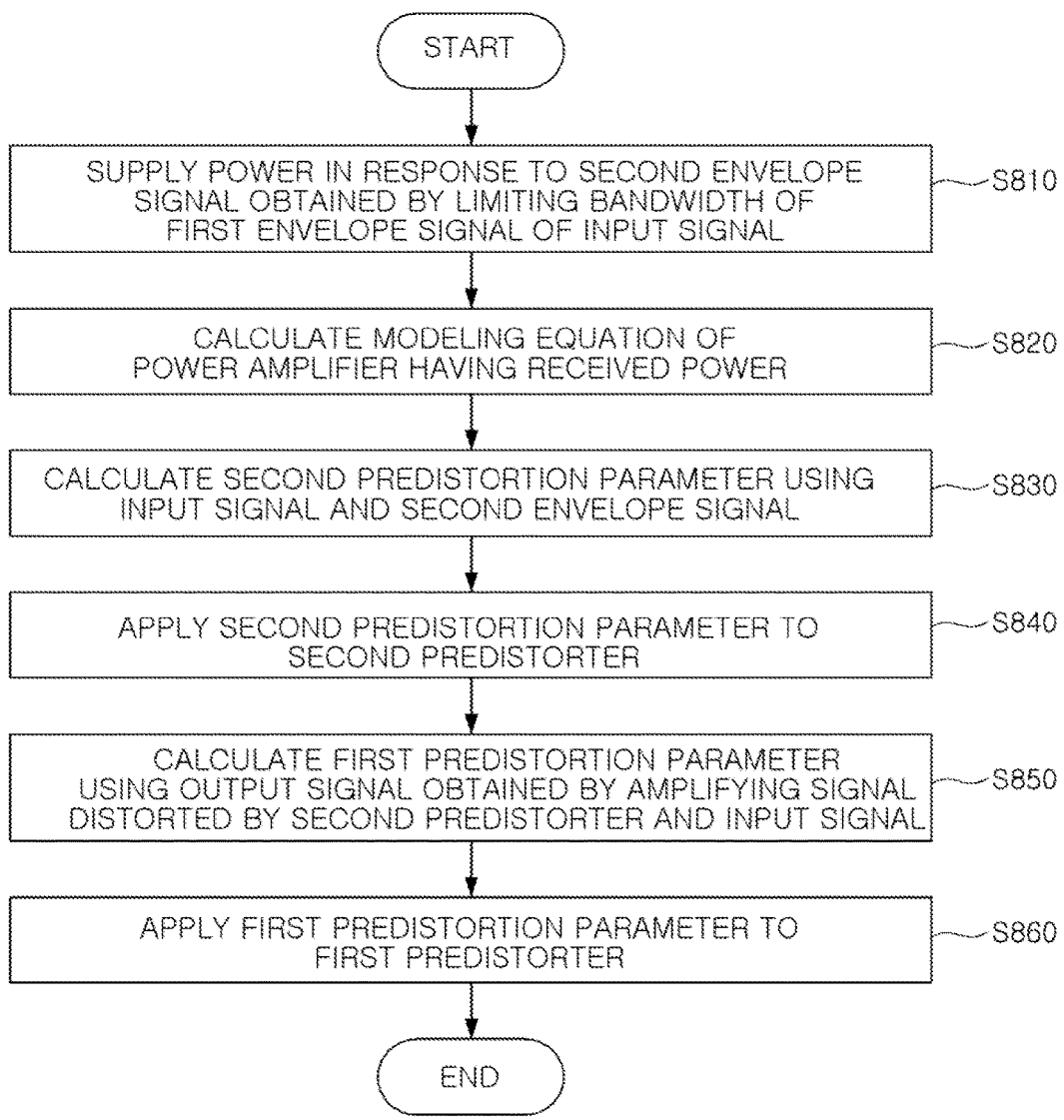
FIG. 8 is a flow chart of an example of an envelope tracking power amplifying method.

FIG. 8 is a flow chart of an example of an envelope tracking power amplifying method. For example, the method performs operations S810, S820, S830, S840, S850, and S860, as discussed further below.

With reference to the example of FIG. 8, in operation S810, the power supply 300 supplies a source voltage Vss, in response to a second envelope signal obtained by limiting a bandwidth of a first envelope signal of an input signal. In this example, the first predistorter controller 110, and the second predistorter controller 210, are in a bypass state in which a signal input thereto is transferred as an output, as it is, without being distorted.

Further, in operation S820, the first adapter 120 calculates a modeling equation of the power amplifier 400 having received the source voltage Vss, in a bypass state of the first predistorter controller 110 and the second predistorter controller 210.

After calculating the modeling equation, in operation S830, the second adapter 220 calculates a second predistortion parameter using the input signal and the second envelope signal, and, in operation S840, applies the second predistortion parameter to the second predistorter.

In operation S850, the first adapter 120 calculates the first predistortion parameter using an output signal obtained by amplifying a signal distorted by the second predistorter and the input signal, in operation S850, and in operation S860, applies the first predistortion parameter to the first predistorter.

Further details with respect to the embodiment of an envelope tracking power amplifying method would be understandable from an envelope estimation apparatus described above with reference to FIGS. 1 to 3, and thus, an overlapping and redundant description thereof is omitted for brevity.

As set forth above, in an envelope tracking power amplifying apparatus and method according to embodiments, nonlinearity of a power amplifier may be reduced using two predistorters to which an adaptively calculated parameter has been applied, memory effects may be removed, and power efficiency may be improved accordingly.

The predistorters, power supplies, power amplifiers, predistorter controllers, adapters, amplifiers, detectors, generators, and limiters in FIGS. 1-3 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus comprising:
   a first predistorter configured to calculate a first predistortion parameter and configured to distort an input signal using the first predistortion parameter to output a first distortion signal;
   a second predistorter configured to calculate a second predistortion parameter and configured to distort the first distortion signal using the second predistortion parameter to output a second distortion signal;
   a power supply configured to receive the first distortion signal to generate a first envelope signal, and configured to limit a bandwidth of the first envelope signal to obtain a second envelope signal to supply a source voltage; and
   a power amplifier configured to receive the source voltage and to output an output signal obtained by amplifying the second distortion signal,
   wherein the first predistorter is configured to calculate the first predistortion parameter using the input signal and the output signal.

2. The apparatus of claim 1, wherein the power supply comprises
   an envelope generator configured to generate the first envelope signal according to an amplitude of the first distortion signal, and
   a bandwidth limiter configured to generate the second envelope signal obtained by limiting the bandwidth of the first envelope signal.

3. The apparatus of claim 2, wherein the power supply further comprises an amplitude detector configured to detect the amplitude of the first distortion signal.

4. The apparatus of claim 2, wherein the power supply further comprises a power modulator configured to supply the source voltage that has a voltage based on an amplitude of the second envelope signal.

5. The apparatus of claim 2, wherein the bandwidth limiter is a low pass filter that uses a window function.

6. The apparatus of claim 2, wherein the first predistorter comprises:
a first adapter configured to calculate the first predistortion parameter, based on a differential error between the input signal and the output signal; and
a first predistorter controller configured to output a first distortion signal obtained by distorting an input signal using the first predistortion parameter.

7. The apparatus of claim 6, wherein the first adapter calculates a modeling equation of the power amplifier in order to calculate the first predistortion parameter.

8. The apparatus of claim 7, wherein the first predistorter distorts the input signal by using the first predistortion parameter and an output signal that is estimated by using the modeling equation.

9. The apparatus of claim 2, wherein the second predistorter comprises:
a second adapter configured to calculate the second predistortion parameter, based on a differential error between the first distortion signal and the second envelope signal; and
a second predistorter controller configured to output a second distortion signal obtained by distorting the first distortion signal using the second predistortion parameter.

10. The apparatus of claim 9, wherein the second predistorter distorts the first distortion signal using the second predistortion parameter and an output signal that is estimated using a modeling equation of the power amplifier.

11. The apparatus of claim 1, wherein the first predistorter and second predistorter calculate the first and second predistortion parameters using a recursive least-squares (RLS) algorithm, respectively.

12. A method, comprising:
supplying a source voltage in response to receiving a second envelope signal obtained by limiting a bandwidth of a first envelope signal of an input signal;
calculating a modeling equation of a power amplifier based on the source voltage;
calculating a second predistortion parameter using the input signal and the second envelope signal;
applying the second predistortion parameter to a second predistorter; and
calculating a first predistortion parameter using an output signal obtained by amplifying a signal distorted by the second predistorter and the input signal.

13. The method of claim 12, wherein the supplying of the source voltage comprises:
detecting an amplitude of the input signal;
generating a first envelope signal according to the detected amplitude; and
limiting a bandwidth of the first envelope signal.

14. The method of claim 12, wherein the modeling equation and the first and second predistortion parameters are calculated using a recursive least-squares (RLS) algorithm.

15. The method of claim 12, wherein the second envelope signal is a signal obtained by limiting a bandwidth of the first envelope signal through a low pass filter using a window function.

16. The method of claim 12, wherein the calculating of the second predistortion parameter is performed by calculating a second predistortion parameter, which is a polynomial parameter, and by distorting the input signal to compensate for a differential error between the input signal and the second envelope signal.

17. The method of claim 12, wherein the calculating of the first predistortion parameter is performed by calculating a first predistortion parameter, which is a polynomial parameter, and by distorting the input signal to compensate for a differential error between the output signal obtained by amplifying a signal distorted by the second predistorter and the input signal.

18. The method of claim 12, further comprising applying the first predistortion parameter to a first predistorter.

19. The apparatus of claim 1, wherein the second predistorter is configured to calculate the second predistortion parameter using the input signal and the second envelope signal.

* * * * *